United States Patent
Kim et al.

(10) Patent No.: US 10,096,687 B2
(45) Date of Patent: Oct. 9, 2018

(54) SEMICONDUCTOR DEVICE AND METHOD OF FABRICATING THE SAME

(71) Applicant: Hyundai Autron Co., Ltd., Seongnam-si (KR)

(72) Inventors: Tae Youp Kim, Seongnam-si (KR); Hyuk Woo, Seongnam-si (KR); Young Joon Kim, Seongnam-si (KR); Tae Young Park, Seongnam-si (KR); Han Sin Cho, Seongnam-si (KR); Yoon Chul Choi, Seongnam-si (KR)

(73) Assignee: Hyundai Autron Co., Ltd., Seongnam-si (KR)

( * ) Notice: Subject to any disclaimer, the term of this patent is extended or adjusted under 35 U.S.C. 154(b) by 0 days.

(21) Appl. No.: 15/592,489

(22) Filed: May 11, 2017

(65) Prior Publication Data

US 2017/0330945 A1    Nov. 16, 2017

(30) Foreign Application Priority Data

May 11, 2016    (KR) .......................... 10-2016-0057678

(51) Int. Cl.
| | |
|---|---|
| *H01L 29/66* | (2006.01) |
| *H01L 29/423* | (2006.01) |
| *H01L 29/08* | (2006.01) |
| *H01L 29/16* | (2006.01) |

(Continued)

(52) U.S. Cl.
CPC ...... *H01L 29/4236* (2013.01); *H01L 29/0623* (2013.01); *H01L 29/0847* (2013.01); *H01L 29/0865* (2013.01); *H01L 29/1608* (2013.01); *H01L 29/42376* (2013.01);

(Continued)

(58) Field of Classification Search
CPC ............ H01L 29/4236; H01L 29/7827; H01L 29/0847
See application file for complete search history.

(56) References Cited

U.S. PATENT DOCUMENTS

| | | | |
|---|---|---|---|
| 6,545,316 B1 * | 4/2003 | Baliga ............. | H01L 21/823487 257/329 |
| 6,573,534 B1 | 6/2003 | Kumar et al. | |
| 2012/0267704 A1 | 10/2012 | Siemieniec et al. | |

(Continued)

FOREIGN PATENT DOCUMENTS

| | | |
|---|---|---|
| KR | 10-0219057 B1 | 9/1999 |
| KR | 10-2005-0056223 A | 6/2005 |

(Continued)

*Primary Examiner* — A. Sefer
(74) *Attorney, Agent, or Firm* — Baker McKenzie; Hyunho Park

(57) ABSTRACT

Provided are a semiconductor device, the semiconductor device comprise, a substrate which comprises a first surface and a second surface facing the first surface, an epitaxial layer which is formed on the first surface of the substrate and has a first conductivity type, a base region which is formed in the epitaxial layer and has a second conductivity type different from the first conductivity type, a source region which is formed in the base region and has the first conductivity type, a channel region which is formed in the base region to be separated from the source region and has the first conductivity type and a barrier region which is formed between the source region and the channel region and has the second conductivity type.

9 Claims, 6 Drawing Sheets

(51) Int. Cl.
*H01L 29/78* (2006.01)
*H01L 29/06* (2006.01)
(52) U.S. Cl.
CPC ...... *H01L 29/7827* (2013.01); *H01L 29/7828* (2013.01); *H01L 29/7831* (2013.01)

(56) References Cited

U.S. PATENT DOCUMENTS

2013/0341643 A1* 12/2013 Kudou .............. H01L 29/66068
257/77
2015/0333175 A1* 11/2015 Kiyosawa ........... H01L 29/6606
257/77

FOREIGN PATENT DOCUMENTS

KR   10-2010-0021801 A   2/2010
KR   10-2014-0020976 A   2/2014

* cited by examiner

SEMICONDUCTOR DEVICE AND METHOD OF FABRICATING THE SAME

This application claims the benefit of Korean Patent Application No. 10-2016-0057678, filed on May 11, 2016, in the Korean Intellectual Property Office, the disclosure of which is incorporated herein by reference in its entirety.

BACKGROUND

1. Field

The present inventive concept relates to a semiconductor device and a method of fabricating the same.

2. Description of the Related Art

In recent years, semiconductor devices have become smaller and highly performing. As a result, semiconductor devices require low heat generation and high durability. In particular, metal-oxide-semiconductor field-effect transistors (MOSFETs) are required to have low on-resistance (Ron), minimum threshold voltage variation, and minimum leakage current variation.

To prevent a punch-through phenomenon in a channel region of a MOSFET, a long channel depletion region is required, which, however, can cause an increase in on-resistance.

SUMMARY

Aspects of the inventive concept provide a semiconductor device capable of securing operational stability through a barrier region and a method of fabricating the semiconductor device.

However, aspects of the inventive concept are not restricted to the one set forth herein. The above and other aspects of the inventive concept will become more apparent to one of ordinary skill in the art to which the inventive concept pertains by referencing the detailed description of the inventive concept given below.

According to an aspect of the inventive concept, there is provided a semiconductor device, the semiconductor device comprise, a substrate which comprises a first surface and a second surface facing the first surface, an epitaxial layer which is formed on the first surface of the substrate and has a first conductivity type, a base region which is formed in the epitaxial layer and has a second conductivity type different from the first conductivity type, a source region which is formed in the base region and has the first conductivity type, a channel region which is formed in the base region to be separated from the source region and has the first conductivity type and a barrier region which is formed between the source region and the channel region and has the second conductivity type.

In some embodiments, the barrier region is formed between the source region and the channel region to contact the source region and the channel region.

In some embodiments, the barrier region has the same impurity concentration as the base region.

In some embodiments, the semiconductor device further comprises a gate trench which is formed in the epitaxial layer to be separated from the base region and a gate electrode which comprises a first gate electrode portion formed on an upper surface of the epitaxial layer to overlap the barrier region and the channel region and a second gate electrode portion filling the gate trench.

In some embodiments, the semiconductor device further comprises a trench bottom doped region which is formed in the epitaxial layer on a bottom surface of the gate trench and has the second conductivity type.

In some embodiments, a distance from the second gate electrode portion to the barrier region is greater than a distance from the second gate electrode portion to the channel region.

In some embodiments, a distance from the second gate electrode portion to the source region is greater than the distance from the second gate electrode portion to the barrier region.

In some embodiments, the source region, the channel region and the barrier region are formed at a surface of the epitaxial layer.

In some embodiments, the semiconductor further comprises a drain electrode which is formed on the second surface of the substrate.

The details of other embodiments are included in the detailed description and drawings.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
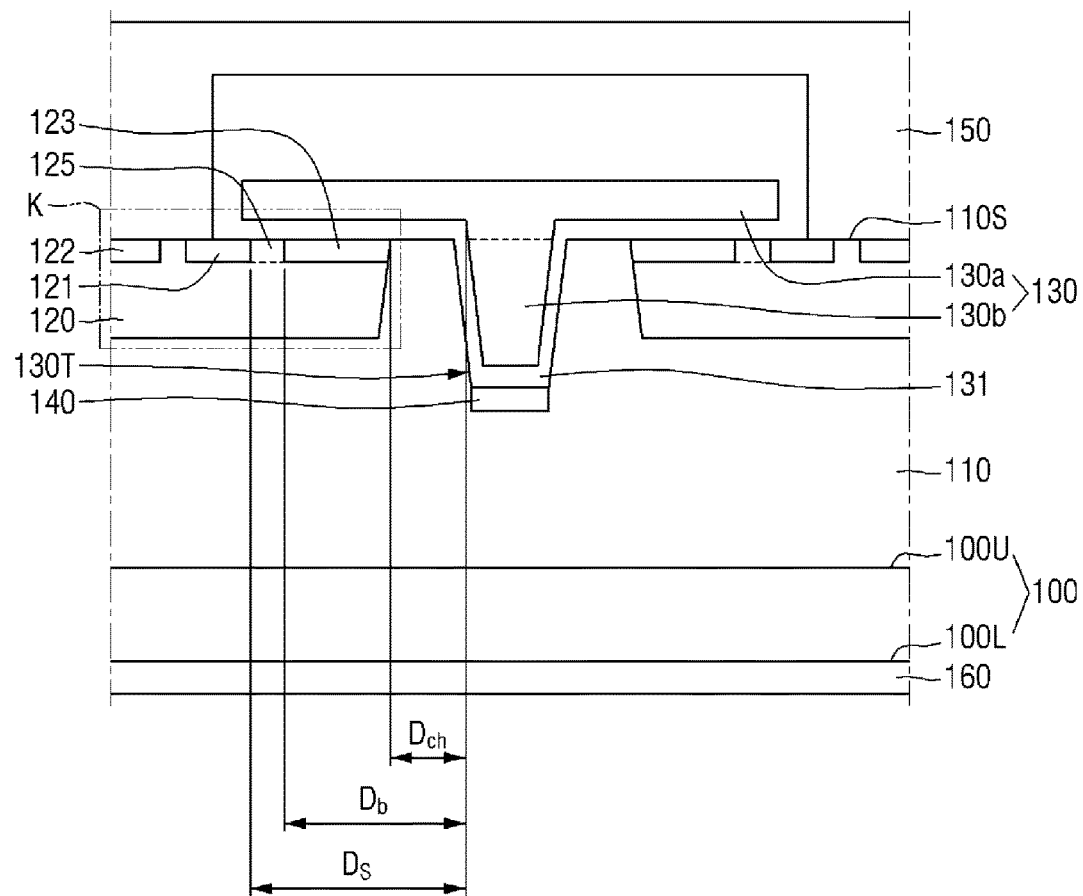
FIG. 1 is a cross-sectional view of a semiconductor device according to embodiments.

Advantages and features of the present inventive concept and methods of accomplishing the same may be understood more readily by reference to the following detailed description of preferred embodiments and the accompanying drawings. The present inventive concept may, however, be embodied in many different forms and should not be construed as being limited to the embodiments set forth herein. Rather, these embodiments are provided so that this disclosure will be thorough and complete and will fully convey the concept of the inventive concept to those skilled in the art, and the present inventive concept will only be defined by the appended claims. In the drawings, the thickness of layers and regions are exaggerated for clarity.

It will be understood that when an element or layer is referred to as being "on" or "connected to" another element or layer, it can be directly on or connected to the other element or layer or intervening elements or layers may be present. In contrast, when an element is referred to as being "directly on" or "directly connected to" another element or layer, there are no intervening elements or layers present. Like numbers refer to like elements throughout. As used herein, the term "and/or" includes any and all combinations of one or more of the associated listed items.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the inventive concept (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept.

The present inventive concept will be described with reference to perspective views, cross-sectional views, and/or plan views, in which preferred embodiments of the inventive concept are shown. Thus, the profile of an exemplary view may be modified according to manufacturing techniques and/or allowances. That is, the embodiments of the inventive concept are not intended to limit the scope of the present inventive concept but cover all changes and modifications that can be caused due to a change in manufacturing process. Thus, regions shown in the drawings are illustrated in schematic form and the shapes of the regions are presented simply by way of illustration and not as a limitation.

Unless defined otherwise, all technical and scientific terms used herein have the same meaning as commonly understood by one of ordinary skill in the art to which this inventive concept belongs. It is noted that the use of any and all examples, or exemplary terms provided herein is intended merely to better illuminate the inventive concept and is not a limitation on the scope of the inventive concept unless otherwise specified. Further, unless defined otherwise, all terms defined in generally used dictionaries may not be overly interpreted.

Hereinafter, a semiconductor device according to embodiments will be described with reference to FIGS. 1 and 2.

FIG. 1 is a cross-sectional view of a semiconductor device according to embodiments. FIG. 2 is an enlarged view of an area 'K' of FIG. 1.

Referring to FIG. 1, the semiconductor device according to the technical spirit of the inventive concept may include a substrate 100, an epitaxial layer 110, a base region 120, a gate electrode 130, a source electrode 150, and a drain electrode 160.

The substrate 100 may include a first surface 100U and a second surface 100L. The first surface 100U of the substrate 100 may face the second surface 100L of the substrate 100.

The substrate 100 may be a bulk silicon substrate or a silicon-on-insulator (SOI) substrate. Otherwise, the substrate 100 may be a silicon substrate or a substrate made of another material such as silicon carbide, silicon germanium, indium antimonide, lead telluride, indium arsenide, indium phosphide, gallium arsenide or gallium antimonide. In some embodiments, the substrate 100 may be a silicon carbide (SiC) substrate.

The substrate 100 may have, for example, an n+ conductivity type. N-type impurities may include, e.g., phosphorus (P) or nitrogen (N).

The epitaxial layer 110 may be formed on the first surface 100U of the substrate 100. The epitaxial layer 110 may have a first conductivity type. In some embodiments according to the technical spirit of the inventive concept, the first conductivity type may be an n conductivity type. However, the first conductivity type may also be a p conductivity type.

The epitaxial layer 110 may have an impurity concentration lower than the impurity concentration of the substrate 100. For example, when the substrate 100 has an n+ conductivity type, the epitaxial layer 110 may have an n− conductivity type. The epitaxial layer 110 may include, for example, silicon carbide (SiC).

The p impurity concentration of the epitaxial layer 110 may be, for example, substantially zero.

The impurity concentration and thickness of the epitaxial layer 110 may be determined according to the magnitude of a desired breakdown voltage.

The base region 120 may be formed in the epitaxial layer 110. For example, the base region 120 may be formed at a surface 110s of the epitaxial layer 110. Although the base region 120 is illustrated as being trapezoidal in the drawing, this is merely for ease of description, and the base region 120 is not necessarily trapezoidal. For example, depending on the process, a boundary surface between the base region 120 and the epitaxial layer 110 may have a curvature.

The base region 120 may have a second conductivity type. The second conductivity type may be different from the first conductivity type. For example, when the first conductivity type is an n type or a p type, the second conductivity type may be a p type or an n type. In some embodiments according to the technical spirit of the inventive concept, the base region 120 may have a p− conductivity type. P-type impurities may include, for example, aluminum (Al) or boron (B).

The base region 120 may include a source region 121, a p+ region 122, a channel region 123, and a barrier region 125.

The source region 121 may be formed in the base region 120. More specifically, the source region 121 may be formed in the base region 120 and at the surface 110s of the epitaxial layer 110. A thickness of the source region 121 may be smaller than that of the base region 120.

The source region 121 may have the first conductivity type. In some embodiments according to the technical spirit of the inventive concept, the source region 121 may have an n+ conductivity type.

The p+ region 122 may be formed in the base region 120. More specifically, the p+ region 122 may be formed in the base region 120 and at the surface 110s of the epitaxial layer 110.

Although the p+ region 122 is illustrated as being separated from the source region 121, the inventive concept is not limited to this case. For example, the p+ region 122 may also be formed to directly contact the source region 121.

Also, although the p+ region 122 is illustrated as being formed on substantially the same plane as the source region 121, the inventive concept is not limited to this case. For example, the p+ region 122 may also be formed at a position higher or lower than the source region 121 with respect to the first surface 100U of the substrate 100.

The channel region 123 may be formed in the base region 120. More specifically, the channel region 123 may be formed in the base region 120 and at the surface 110s of the epitaxial layer 110. A thickness of the channel region 123 may be smaller than that of the base region 120.

The channel region 123 may be separated from the source region 121. A length of the channel region 123 may be, e.g., greater than that of the source region 121.

The channel region 123 may have, for example, the first conductivity type. In some embodiments according to the technical spirit of the inventive concept, the channel region 123 may have an n− conductivity type.

Although the p+ region 122, the source region 121, and the channel region 123 are illustrated as being rectangular in the drawing, this is merely for ease of description, and the p+ region 122, the source region 121, and the channel region 123 are not necessarily rectangular. For example, depending on the process, a boundary surface between the base region 120 and each of the p+ region 122, the source region 121 and the channel region 123 may have a curvature.

The barrier region 125 may be formed in the base region 120. More specifically, the barrier region 125 may be formed in the base region 120 and at the surface 110s of the epitaxial layer 110.

Figure 2:
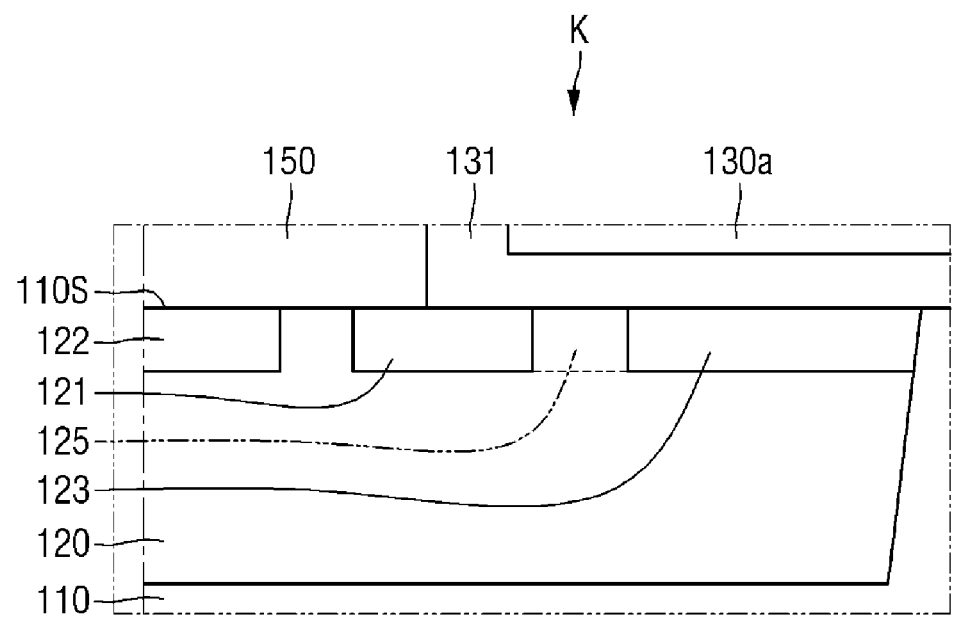
FIG. 2 is an enlarged view of an area 'K' of FIG. 1.

Referring also to FIG. 2, the barrier region 125 may be formed between the source region 121 and the channel region 123. In some embodiments according to the technical spirit of the inventive concept, the barrier region 125 may be formed to directly contact the source region 121 and the channel region 123. That is, a region of the barrier region 125 may directly contact the source region 121, and the other region of the barrier region 125 may directly contact the channel region 123.

The barrier region 125 may be defined as a region formed between the source region 121 and the channel region 123 separated from each other. For example, the barrier region 125 may be part of the base region 120.

The barrier region 125 may include substantially the same material as the base region 120. The barrier region 125 may have the second conductivity type. In some embodiments according to the technical spirit of the inventive concept, the barrier region 125 may have a p− conductivity type. The impurity concentration of the barrier region 125 may be substantially the same as the impurity concentration of the base region 120.

The semiconductor device according to the technical spirit of the inventive concept can reduce a punch-through phenomenon by including the barrier region 125 between the channel region 123 and the source region 121.

In other words, the semiconductor device according to the technical spirit of the inventive concept can secure operational stability through the barrier region 125.

Referring back to FIG. 1, a gate trench 130T may be formed in the epitaxial layer 110. A bottom surface and both sidewalls of the gate trench 130T may be defined by the epitaxial layer 110. Although both sidewalls of the gate trench 130T are illustrated as being inclined at an angle to the first surface 100U of the substrate 100, the inventive concept is not limited to this case. For example, both sidewalls of the gate trench 130T can also be perpendicular to the first surface 100U of the substrate 100.

The gate trench 130T may be separated from the base region 120.

The gate electrode 130 may include a first gate electrode portion 130a and a second gate electrode portion 130b.

The first gate electrode portion 130a may be formed on an upper surface of the epitaxial layer 110 to overlap at least part of the source region 121, the barrier region 125 and the channel region 123. The second gate electrode portion 130b may be formed to fill the gate trench 130T. The gate electrode 130 may include a conductive material. Although the gate electrode 130 is illustrated as a single layer, it is not necessarily a single layer. For example, the gate electrode 130 may include a work function conductive layer for controlling a work function and a filling conductive layer for filling a space formed by the work function conductive layer.

The gate electrode 130 may include at least one of TiN, WN, TaN, Ru, TiC, TaC, Ti, Ag, Al, TiAl, TiAlN, TiAlC, TaCN, TaSiN, Mn, Zr, W and Al. Alternatively, the gate electrode 130 may be made of a non-metal material such as Si or SiGe.

A gate insulating layer 131 may be formed between the epitaxial layer 110 and the gate electrode 130. In other words, the gate insulating layer 131 may be formed along the sidewalls and bottom surface of the gate trench 130T. In addition, the gate insulating layer 131 may be formed between the epitaxial layer 110 and the base region 120 and the gate electrode 130 to surround the gate electrode 130.

A part of the gate insulating layer 131 may be formed on the upper surface of the epitaxial layer 110 to overlap a part of the base region 120. Specifically, a part of the gate insulating layer 131 may be formed on the upper surface of the epitaxial layer 110 to overlap a part of the source region 121, the barrier region 125, and the channel region 123.

Although the gate insulating layer 131 is illustrated as a single layer in the drawing, it is not necessarily a single layer. For example, the gate insulating layer 131 may include an interfacial layer and a high dielectric constant (high-k) insulating layer.

The gate insulating layer 131 may include a high-k material having a higher dielectric constant than a silicon oxide layer. For example, the high-k material may include one or more of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

The gate insulating layer 131 may not include the interfacial layer depending on the material contained in the epitaxial layer 110. In this case, the gate insulating layer 131 may include a silicon oxide layer, a silicon oxynitride layer or a silicon nitride layer in addition to the high-k material.

The source region 121 may be formed farther from the second gate electrode portion 130b than the channel region 123 and the barrier region 125. A distance Ds from the second gate electrode portion 130b to the source region 121 may be greater than a distance Db from the second gate electrode portion 130b to the barrier region 125 and a distance Dch from the second gate electrode portion 130b to the channel region 123.

The barrier region 125 may be formed farther from the second gate electrode portion 130b than the channel region 123. The barrier region 125 may be formed closer to the second gate electrode portion 130b than the source region 121. The distance Db from the second gate electrode portion 130b to the barrier region 125 may be greater than the distance Dch from the second gate electrode portion 130b to the channel region 123. The distance Db from the second gate electrode portion 130b to the barrier region 125 may be smaller than the distance Ds from the second gate electrode portion 130b to the source region 121.

A trench bottom doped region 140 may be formed in the epitaxial layer 110 on the bottom surface of the gate trench 130T. For example, the trench bottom doped region 140 may have the second conductivity type.

In some embodiments according to the technical spirit of the inventive concept, the trench bottom doped region 140 may contact the gate insulating layer 131.

Although the trench bottom doped region 140 is illustrated in the drawing as being rectangular, this is merely for ease of description, and the trench bottom doped region 140 is not necessarily rectangular. For example, boundary surfaces of the trench bottom doped region 140 may have a curvature depending on the process.

The semiconductor device according to the technical spirit of the inventive concept can secure robustness by relieving an electric field in the bottom surface portion of the gate trench 130T by forming the trench bottom doped region 140.

Although a width of the trench bottom doped region 140 is illustrated as being equal to a width of the bottom surface of the gate trench 130T, the inventive concept is not limited to this case. For example, depending on the process, the width of the trench bottom doped region 140 can be different from the width of the bottom surface of the gate trench 130T.

The source electrode 150 may cover the gate insulating layer 131. In addition, the source electrode 150 may contact part of the source region 121.

The source electrode 150 may include, but not limited to, tungsten. For example, the source electrode 150 may include a conductive material.

The drain electrode 160 may be formed on the second surface 100L of the substrate 100. The drain electrode 160 may include a conductive material.

A method of fabricating a semiconductor device according to embodiments will hereinafter be described. For the sake of clarity, elements and features identical to those described above will be omitted.

FIGS. 3 through 9 are views illustrating steps of a method of fabricating a semiconductor device according to embodiments.

Figure 3:
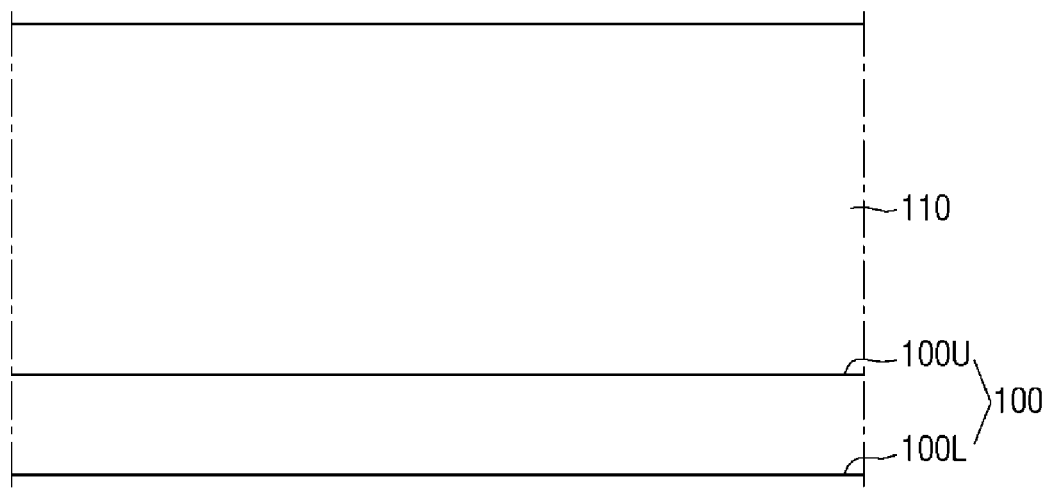
FIGS. 3 through 9 are views illustrating steps of a method of fabricating a semiconductor device according to embodiments.

Referring to FIG. 3, an epitaxial layer 110 may be formed on a first surface 100U of a substrate 100.

Figure 4:
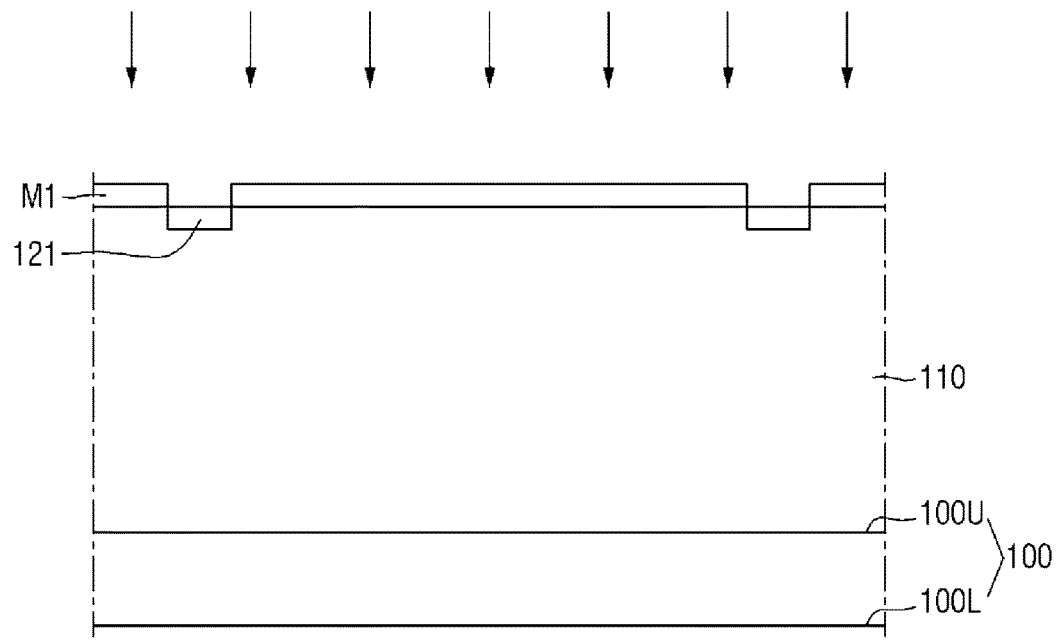

Referring to FIG. 4, a source region 121 may be formed in the epitaxial layer 110. The source region 121 may be formed through a doping process using a mask pattern M1.

Specifically, a photoresist layer may be formed on the epitaxial layer 110 to cover the epitaxial layer 110, and the mask pattern M1 may be formed by performing a photolithography process on the photoresist layer.

The photoresist layer may be, but is not limited to, a single layer.

That is, the photoresist layer may include an anti-reflective layer to prevent reflection of light due to an underlying layer during a photolithography process. The anti-reflective layer may include, but not limited to, a bottom anti-reflective coating (BARC) or a developable bottom anti-reflective coating (dBARC).

After the formation of the photoresist layer, a photoresist pattern for forming the mask pattern M1 may be formed by a photo process. At this time, the photoresist pattern may not be formed in a region where the source region 121 is to be formed, but may be formed in a region where the source region 121 is not to be formed.

The mask pattern M1 may be formed by removing a mask layer using the photoresist pattern as an etching mask. After the formation of the mask pattern M1, the photoresist pattern may be removed.

Using the mask pattern M1 that exposes only the region where the source region 121 is to be formed, impurities may be implanted only into the region where the source region 121 is to be formed in a doping process. In some embodiments according to the technical spirit of the inventive concept, the impurities implanted into the source region 121 may be pentavalent ions.

After the doping process for forming the source region 121, the mask pattern M1 may be removed.

Figure 5:
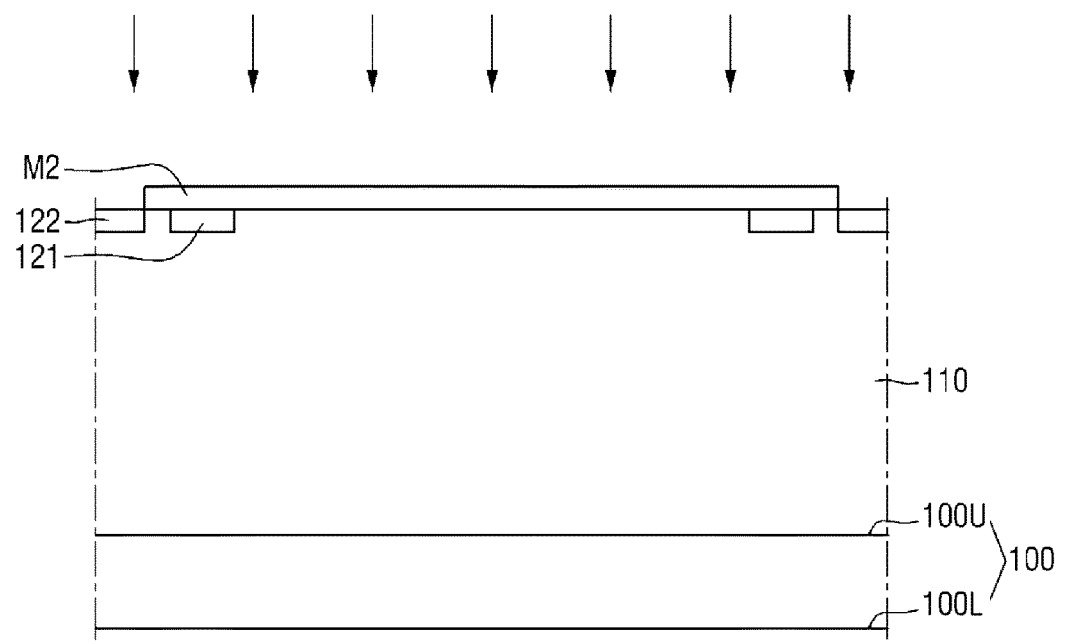

Referring to FIG. 5, a p+ region 122 may be formed in the epitaxial layer 110. The p+ region 122 may be formed through a doping process using a mask pattern M2. Impurities implanted into the p+ region 122 during the doping process may be, for example, trivalent ions. The mask pattern M2 may be formed through substantially the same process as the process for forming the mask pattern M1.

After the doping process for forming the p+ region 122, the mask pattern M2 may be removed.

Figure 6:
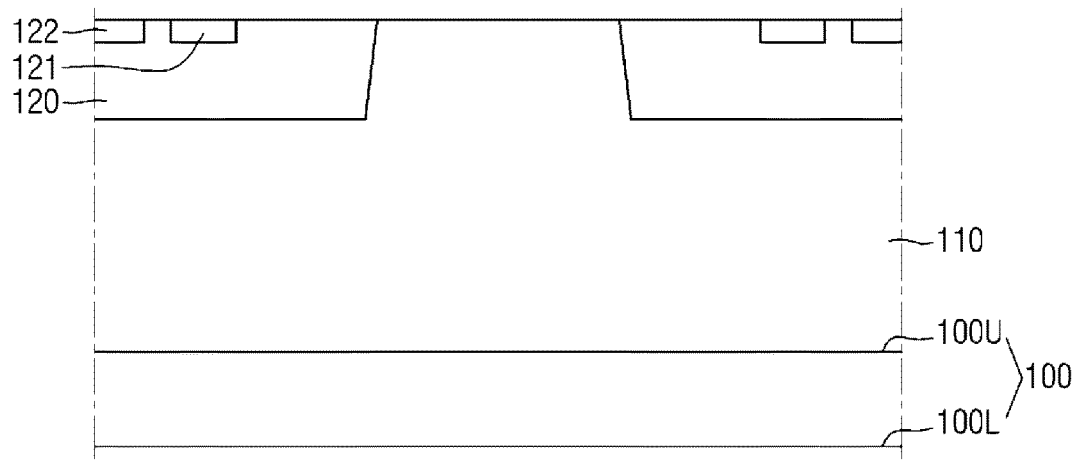

Referring to FIG. 6, a base region 120 may be formed in the epitaxial layer 110. The base region 120 may be formed through a doping process using a mask.

Figure 7:
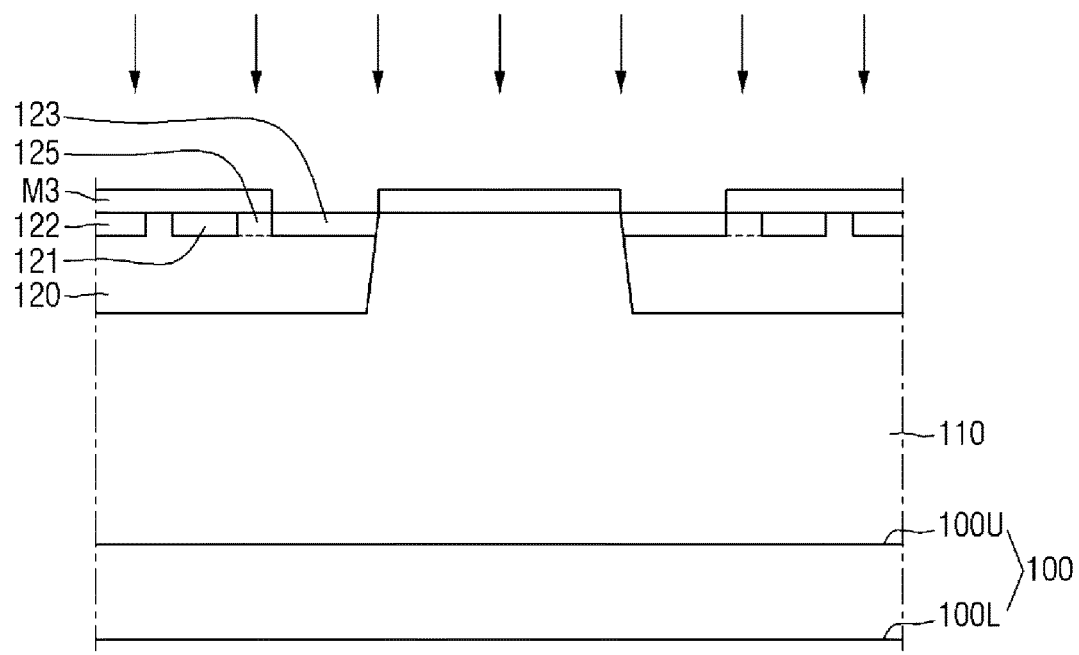

Referring to FIG. 7, a channel region 123 and a barrier region 125 may be formed in the base region 120.

The channel region 123 may be formed through a doping process using a mask pattern M3. The mask pattern M3 may be formed through substantially the same process as the processes for forming the mask patterns M1 and M2.

Since the mask pattern M3 is formed such that the channel region 123 is separated from the source region 121, a region between the source region 121 and the channel region 123 to which no impurities are implanted may maintain the same conductivity type and impurity concentration as the base region 120. That is, the barrier region 125 can be formed during the doping process of the channel region 123 without a separate process such as a doping process. A width of the barrier region 125, that is, a distance between the source region 121 and the channel region 123 may be determined by the mask pattern M3.

Figure 8:
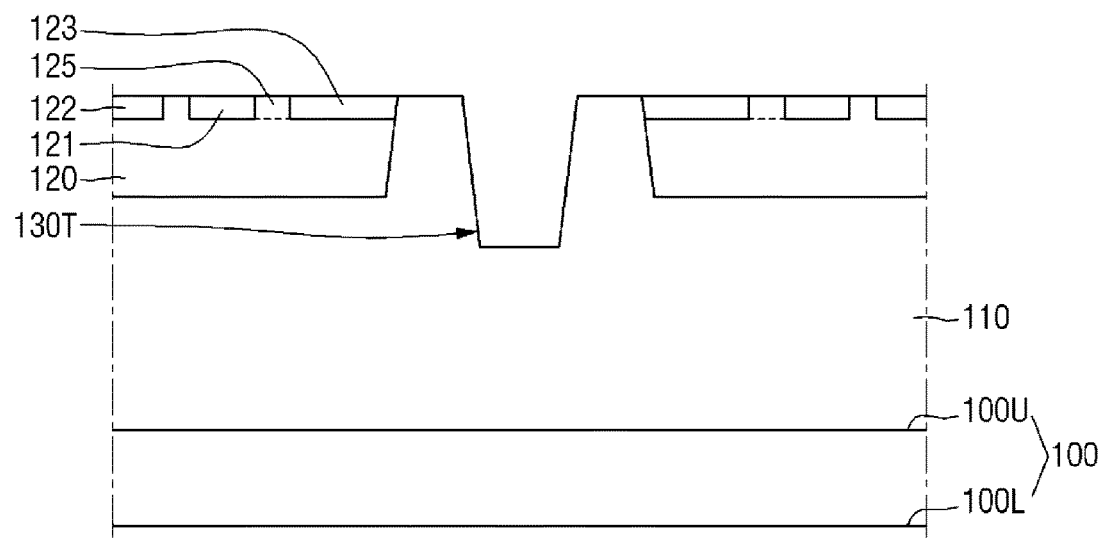

Referring to FIG. 8, a gate trench 130T may be formed in the epitaxial layer 110. The gate trench 130T may be formed by photolithography and etching processes.

Specifically, a photoresist layer may be formed on the epitaxial layer 110 and the base region 120 to cover the epitaxial layer 110 and the base region 120, and a mask pattern may be formed through a photolithography process. The mask pattern may be formed to expose a region where the gate trench 130T is to be formed and to not expose a region where the gate trench 130T is not to be formed. The gate trench 130T may be formed by performing an etching process using the mask pattern as an etching mask. After the formation of the gate trench 130T, the mask pattern may be removed.

Figure 9:
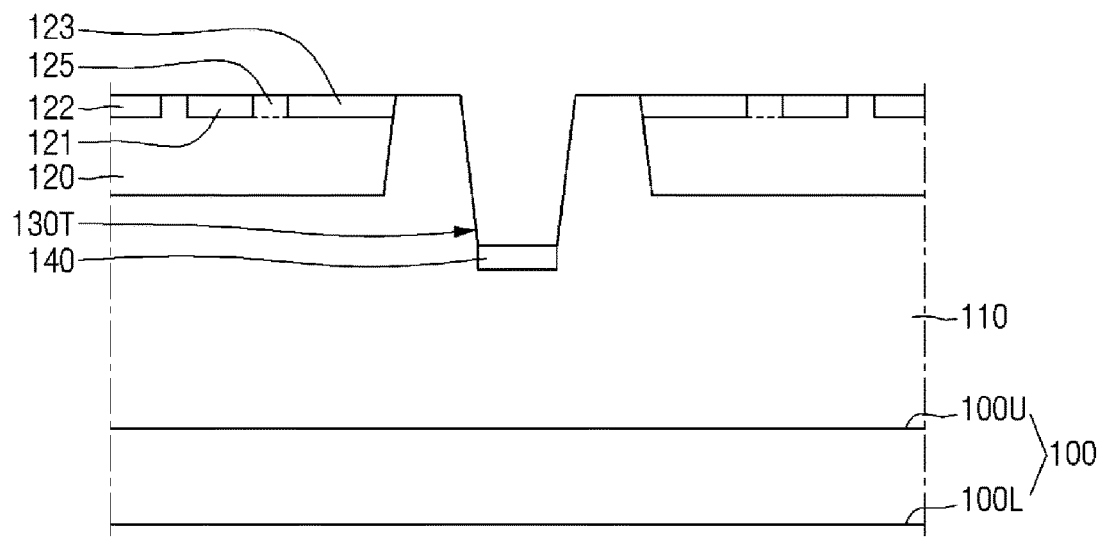

Referring to FIG. 9, a trench bottom doped region 140 may be formed. The trench bottom doped region 140 may be formed by performing, e.g., a doping process on a bottom portion of the gate trench 130T without a separate mask.

Referring to FIG. 1 again, a gate insulating layer 131, a gate electrode 130, a source electrode 150, and a drain electrode 160 may be formed after the process of FIG. 9.

A semiconductor device according to embodiments will hereinafter be described with reference to FIG. 10.

Figure 10:
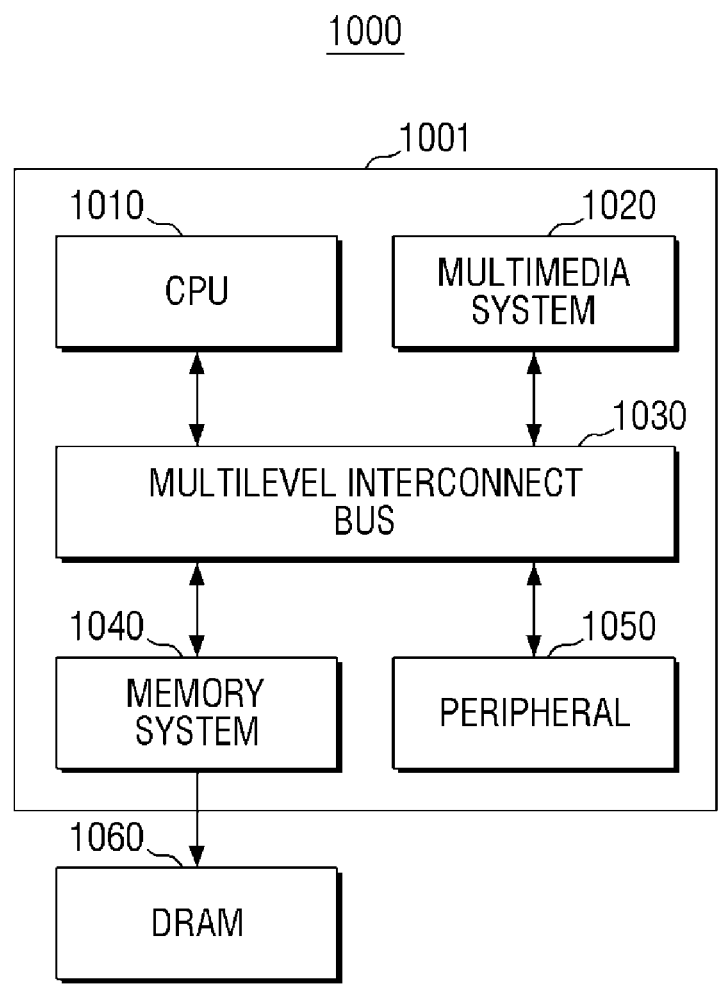
FIG. 10 is a block diagram of a system-on-chip (SoC) system including a semiconductor device according to embodiments.

FIG. 10 is a block diagram of a system-on-chip (SoC) system 1000 including a semiconductor device according to embodiments.

Referring to FIG. 10, the SoC system 1000 includes an application processor 1001 and a dynamic random access memory (DRAM) 1060.

The application processor 1001 may include a central processing unit (CPU) 1010, a multimedia system 1020, a bus 1030, a memory system 1040, and a peripheral circuit 1050.

The CPU 1010 may perform operations needed to drive the SoC system 1000. In some embodiments, the CPU 1010 may be configured as a multi-core environment including a plurality of cores.

The multimedia system 1020 may be used to perform various multimedia functions in the SoC system 1000. The multimedia system 1020 may include a 3D engine module, a video codec, a display system, a camera system, a post-processor, etc.

The bus 1030 may be used for data communication among the CPU 1010, the multimedia system 1020, the memory system 1040 and the peripheral circuit 1050. In some embodiments, the bus 1030 may have a multilayer structure. Specifically, the bus 1030 may be, but is not limited to, a multilayer advanced high-performance bus (AHB) or a multilayer advanced extensible interface (AXI).

The memory system 1040 may provide an environment needed for the application processor 1001 to be connected to an external memory (e.g., the DRAM 1060) and operate at high speed. In some embodiments, the memory system 1040 may include a controller (e.g., a DRAM controller) for controlling the external memory (e.g., the DRAM 1060).

The peripheral circuit 1050 may provide an environment needed for the SoC system 1000 to smoothly connect to an external device (e.g., mainboard). Accordingly, the peripheral circuit 1050 may include various interfaces that enable external devices connected to the SoC system 1000 to be compatible with the SoC system 1000.

The DRAM 1060 may function as a working memory needed for the operation of the application processor 1001. In some embodiments, the DRAM 1060 may be placed outside the application processor 1001 as illustrated in the drawing. Specifically, the DRAM 1060 may be packaged with the application processor 1001 in the form of package on package (PoP).

At least one of the elements of the SoC system 1000 can be fabricated using the method of fabricating a semiconductor device according to the above-described embodiments.

In concluding the detailed description, those skilled in the art will appreciate that many variations and modifications can be made to the preferred embodiments without substantially departing from the principles of the present inventive concept. Therefore, the disclosed preferred embodiments of the inventive concept are used in a generic and descriptive sense only and not for purposes of limitation.

What is claimed is:

1. A semiconductor device comprising:
    a substrate which comprises a first surface and a second surface facing the first surface;
    an epitaxial layer which is formed on the first surface of the substrate and has a first conductivity type;
    a base region which is formed in the epitaxial layer and has a second conductivity type different from the first conductivity type;
    a gate trench which is formed in the epitaxial layer to be spaced apart from the base region;
    a source region which is formed in the base region and has the first conductivity type;
    a channel region which is formed in the base region to be spaced apart from the source region and the gate trench, and has the first conductivity type; and
    a barrier region which is formed between the source region and the channel region and has the second conductivity type.

2. The semiconductor device of claim 1, wherein the barrier region is formed between the source region and the channel region to contact the source region and the channel region.

3. The semiconductor device of claim 1, wherein the barrier region has the same impurity concentration as the base region.

4. The semiconductor device of claim 1, further comprising:
    a gate electrode which comprises a first gate electrode portion formed on an upper surface of the epitaxial layer to overlap the barrier region and the channel region and a second gate electrode portion filling the gate trench.

5. The semiconductor device of claim 4, further comprising a trench bottom doped region which is formed in the epitaxial layer on a bottom surface of the gate trench and has the second conductivity type.

6. The semiconductor device of claim 4, wherein a distance from the second gate electrode portion to the barrier region is greater than a distance from the second gate electrode portion to the channel region.

7. The semiconductor device of claim 4, wherein a distance from the second gate electrode portion to the source region is greater than the distance from the second gate electrode portion to the barrier region.

8. The semiconductor device of claim 1, wherein the source region, the channel region and the barrier region are formed at a surface of the epitaxial layer.

9. The semiconductor device of claim 1, further comprising a drain electrode which is formed on the second surface of the substrate.

* * * * *